United States Patent [19]

Jerman et al.

[11] Patent Number: 4,879,587

[45] Date of Patent: Nov. 7, 1989

[54] APPARATUS AND METHOD FOR FORMING FUSIBLE LINKS

[75] Inventors: John H. Jerman, Palo Alto; Duderik W. DeBruin, Fremont; Stephen C. Terry, Palo Alto, all of Calif.

[73] Assignee: Transensory Devices, Inc., Fremont, Calif.

[21] Appl. No.: 930,653

[22] Filed: Nov. 13, 1986

[51] Int. Cl.$^4$ .................. H01L 27/04; H01L 23/52
[52] U.S. Cl. .......................... 357/55; 357/49; 357/51
[58] Field of Search .............................. 357/49, 51, 55

[56] References Cited

U.S. PATENT DOCUMENTS

| | | | |
|---|---|---|---|
| 3,359,462 | 12/1967 | Schutze et al. | 357/49 |
| 3,564,354 | 2/1971 | Aoki et al. | 357/51 |
| 3,619,725 | 11/1971 | Soden | 357/51 |
| 4,016,483 | 4/1977 | Rudin | 357/51 |
| 4,032,949 | 6/1977 | Bierig | 357/51 |
| 4,198,744 | 4/1980 | Nicolay | 357/51 |
| 4,472,239 | 9/1984 | Johnson et al. | 357/55 |
| 4,528,583 | 7/1985 | te Velde et al. | 357/51 |
| 4,679,310 | 7/1987 | Ramachandra et al. | 357/51 |

FOREIGN PATENT DOCUMENTS

0156989 12/1981 Japan ..................................... 357/51

OTHER PUBLICATIONS

R. S. Mo et al., "Reliability of NiCr 'Fusible Link' Used in PROM's", *J. Electrochem. Soc.*, vol. 120, No. 7, Jul. 1973, pp. 1001–1003.

W. F. Keenan, "Pulsed Overload Tolerance of Si/Cr, Ni/Cr and MO/Si Thin Film Resistors on Integrated Circuits", *IEEE Transaction on Reliability*, vol. R–25, No. 4, Oct. 1976, pp. 248 and 253.

Y. Fukuda et al., "A New Fusible-Type Programmable Element Composed of Aluminum and Polysilicon", *IEEE Transactions on Electron Devices*, vol. ED–33, No. 2, Feb. 1986, pp. 250–253.

Alan B. Brebene, "Analog Integrated Circuit Design", pp. 210–211 and 217, *Microelectronics*.

*Primary Examiner*—Andrew J. James
*Assistant Examiner*—David Soltz
*Attorney, Agent, or Firm*—Fitch, Even, Tabin & Flannery

[57] ABSTRACT

A fusible link is described. It comprises a semiconductor substrate, an electrically insulating layer on the substrate, a pair of conductor elements on the surface of the insulating layer opposite the substrate, and a fuse conductor layer on the surface of the insulating layer opposite the substrate electrically connecting the conductor elements. A cavity is formed in the insulating layer and the substrate adjacent the fuse conductor layer. The cavity has a configuration to provide a substantial reduction in the thermal conductivity cross-section between the fuse conductor layer and the substrate. Such substantial reduction is selected to enable a predetermined electrical power input to the fuse conductor layer to generate an open circuit in the layer. In a preferred form, the cavity has a configuration to form a bridge comprised of the fuse conductor layer and the portion of the insulating layer upon which the fuse conductor layer is disposed.

9 Claims, 3 Drawing Sheets

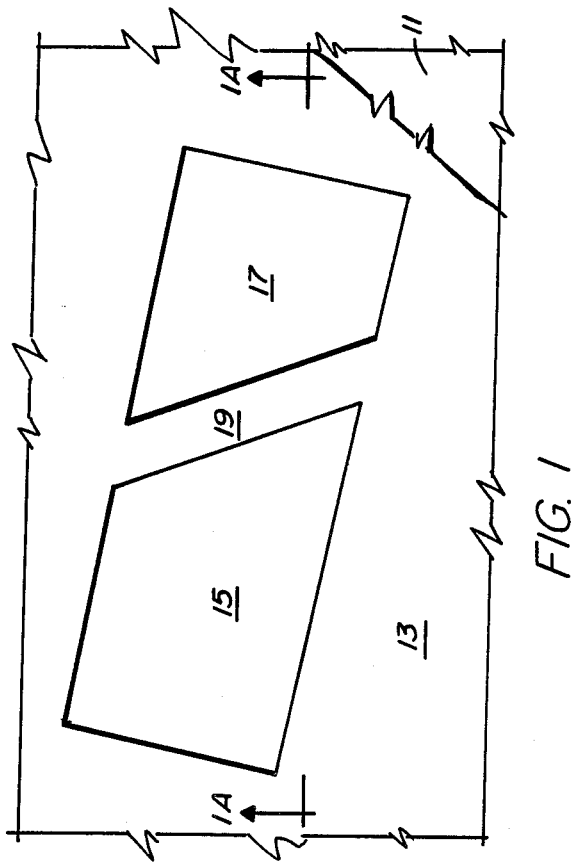
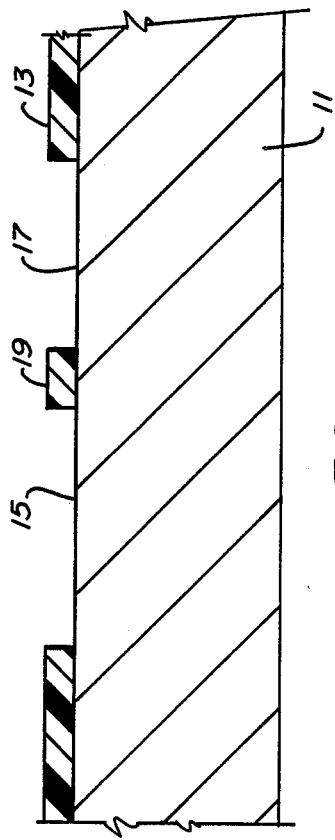
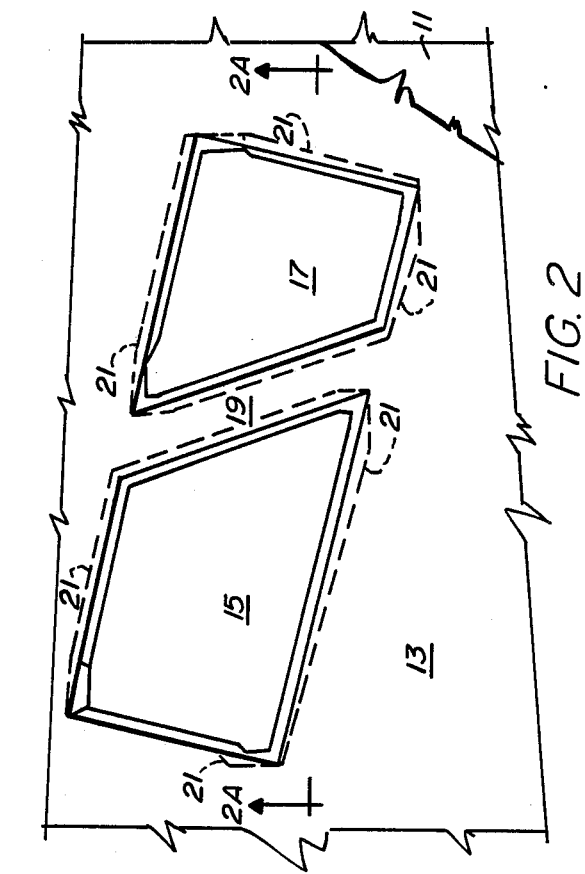
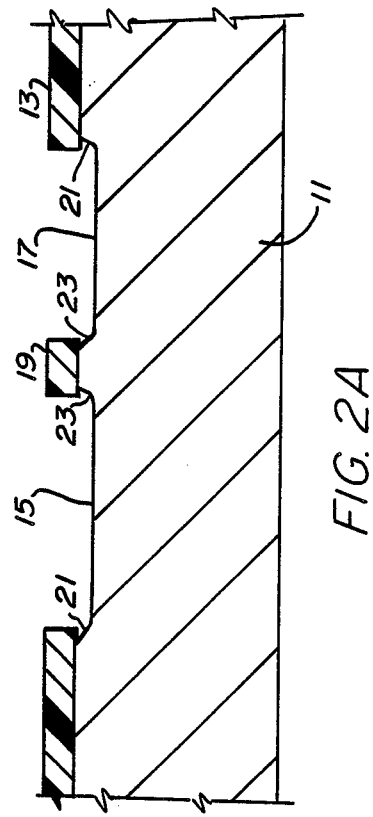

$\delta$ = ANGLE FROM BRIDGE TO CRYSTAL PLANE
$\beta$ = ANGLE FROM EDGE TO CRYSTAL PLANE

APPARATUS AND METHOD FOR FORMING FUSIBLE LINKS

BACKGROUND OF THE INVENTION

This invention relates generally to fusible links and, more particularly, to an improved apparatus and method for forming fusible links on integrated circuits and like devices, such as silicon sensors.

Fusible links are employed extensively in integrated circuit technology. For example, memory elements such as integrated circuit programmable read only memories (PROMS) may be programmed by blowing various combinations of fusible links in the circuit in preselected patterns.

Fusible links for integrated circuits have been comprised of various materials and are generally formed by a narrowed or necked down section of a thin film conductor deposited upon a silicon substrate and insulated from the silicon substrate by a layer of silicon oxide. By applying a preselected voltage across the fusible link, a current is generated to stress the fuse until it fails. Fusible links have typically been constructed of combinations of silicon and chrome, nickel and chrome, molybdenum and silicon, and aluminum and silicon. The failure mechanism of such fusible links typically involves electromigration of the metallization. However, experience with fusible links has shown that voltage requirements to blow the fuses may vary significantly, compromising the reliability and reproducibility of devices based upon fusible links.

SUMMARY OF THE INVENTION

It is an object of the present invention to provide an improved fusible link for use in integrated circuit devices and the like.

Another object of the invention is to provide a fusible link of improved reliability and reproducibility over fusible links known in the prior art.

Another object of the invention is to provide an improved method for forming a fusible link on an integrated circuit substrate.

Other objects of the invention will become apparent to those skilled in the art from the following description, taken in connection with the accompanying drawings wherein:

BRIEF DESCRIPTION OF THE DRAWINGS

FIG. 1 is a schematic plan view of a portion of a semiconductor chip incorporating the invention;

FIG. 1A is a sectional view taken along the line A—A of FIG. 1;

FIGS. 2 through 5 and 2A through 5A are figures corresponding to FIGS. 1 and 1A, respectively, illustrating succeeding steps in forming a fusible link according to the invention.

DESCRIPTION OF THE PREFERRED EMBODIMENT

Figure 3:
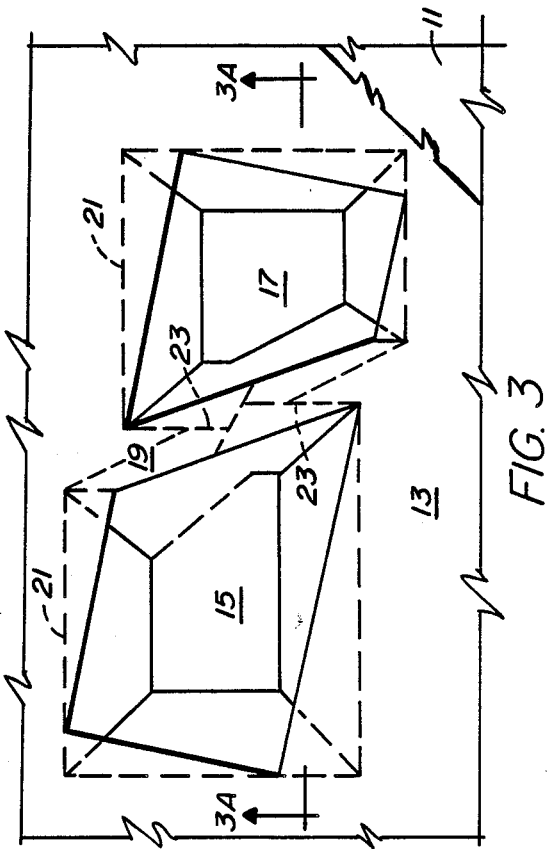

Very generally, the fusible link of this invention comprises a semiconductor substrate, an electrically insulating layer on the substrate, a pair of conductor elements on the surface of the insulating layer opposite the substrate, and a fuse conductor layer on the surface of the insulating layer opposite the substrate electrically connecting the conductor elements. Cavity means are formed in the insulating layer and the substrate adjacent the fuse conductor layer. The cavity means have a configuration to provide a substantial reduction in the thermal conductivity cross section between the fuse conductor layer and the substrate. The substantial reduction is selected to enable a predetermined electrical power input to the fuse conductor layer to generate an open circuit in the layer. In a preferred form, the cavity has a configuration to form a bridge comprised of the fuse conductor layer and the portion of the insulating layer upon which the fuse conductor layer is disposed.

Fusible links formed on the surfaces of semiconductor chips typically employ nichrome or other suitable alloys, and are typically in the thickness range of approximately 200 to 1,000 angstroms. Fuses are blown as a result of the application of power into the fuse conductor. The phenomenon of electromigration, which is a mass transport effect observed in metals under high current densities, is usually involved in the blowing sequence. Electromigration causes the metal atoms to migrate away from a high current density point in the metal fuse conductor, and the conductor is blown when the fuse conductor becomes an open circuit at the point of highest current density. The speed at which electromigration occurs is proportional to the current density and/or the temperature, and is inversely proportional to the lateral dimensions of the fuse conductor normal to the current path.

Dissipation of power in the form of the conduction of heat from the fuse conductor into the adjacent materials directly affects the speed at which electromigration occurs. The present invention reduces the power dissipation rate, thus speeding up the electromigration to thereby reduce the time and power required to blow the fuse. This is done by appropriately reducing the thermal conductivity cross section from the fuse conductor to the surrounding materials.

In a preferred configuration, the thermal conductivity cross section is reduced by undercutting the insulating material which supports the fuse conductor, preferably completely, to form a bridge structure although cantilevers and other undercut structures will work. The thermal conductivity cross section of the bridge structure is defined by that portion of the insulating layer under the fuse conductor which remains contiguous with the rest of the insulating layer plus conduction through the air. Where the bridge structure is completely undercut, only the opposite ends of the bridge are contiguous with the remainder of the insulating structure. Accordingly, the cross section of thermal conductivity is reduced to two times the cross section of the bridge structure itself.

Referring now to FIGS. 1 and 1A, there is depicted, schematically, a semiconductor substrate 11, for example silicon, having an insulating layer 13 formed thereon. The insulating layer may, in the case of a silicon substrate for example, be comprised of silicon dioxide and processes for forming such layers are well known to those skilled in the art. Other combinations of materials are also within the scope of the present invention. The layer 13 may be a dielectric, ceramic, etc., depending upon the particular application.

Using any suitable technique, such as mask photolithography, a pair of windows 15 and 17 are defined in the layer 13 having an orientation such that they generate opposites sides of a bridge region 19. The windows 15 and 17, formed by any suitable means such as the utilization of a photoresist material and an etch, expose the upper surface of the underlying substrate 11. In the embodiment shown, the two windows define a substantially rectangular area. The bridge spans the opposite sides of the defined rectangular area, preferably intersecting the opposite sides at an oblique angle with respect to the 110 crystal direction of silicon.

Following formation of the windows 15 and 17, the underlying substrate 11 is further etched in the region of the windows by a suitable selective etch and, if necessary, by appropriately protecting the insulating layer 13. Various techniques for accomplishing such etching are well known to those in the semiconductor art. A suitable etchant, for example, is potassium hydroxide and water. An anisotropic etchant is preferably used, in order to achieve a controlled undercutting of the substrate 11, as described in detail below. Isotropic etches would be acceptable but are not as useful as anisotropic etches, This is because with an isotropic etch, one cannot control the direction so that the undercut may be equal to the depth of the etch and therefore be inappropriate for certain large bridges.

The initial results of the semiconductor etch of substrate 11 are depicted in FIGS. 2 and 2A. It may be seen that, at certain regions, specifically, the acute angles of the windows 15 and 17, the anisotropic etch begins to undercut the insulating layer 13. These undercut regions are depicted by the dotted lines at 21 in FIG. 2. Typically, the angle between the side wall 23 (FIG. 2A) in the etched region and the upper surface of the semiconductor layer 11 at the interface with the insulating layer 13 forms an angle of about 70°.

As the etch proceeds, the undercut region, indicated by the dotted lines 21, expands at each of the windows 15 and 17. The side walls 23 under bridge region 19 begin to approach each other as the etch continues. The angle of the side walls of the etch underneath the bridge region 19 typically remains, as previously specified, at about 70°. The angle between the underside of the insulating layer 13 and the side walls in the other regions is typically slightly less, usually about 54.5°.

Figure 3A:
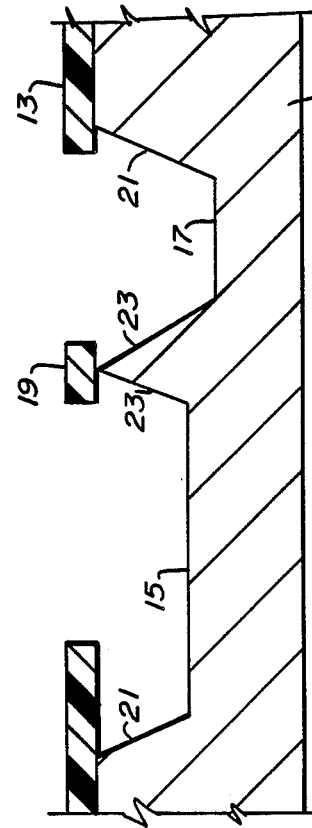

FIGS. 3 and 3A illustrate the point in the etch where the etched regions in windows 15 and 17 first join under bridge region 19.

Figure 4:
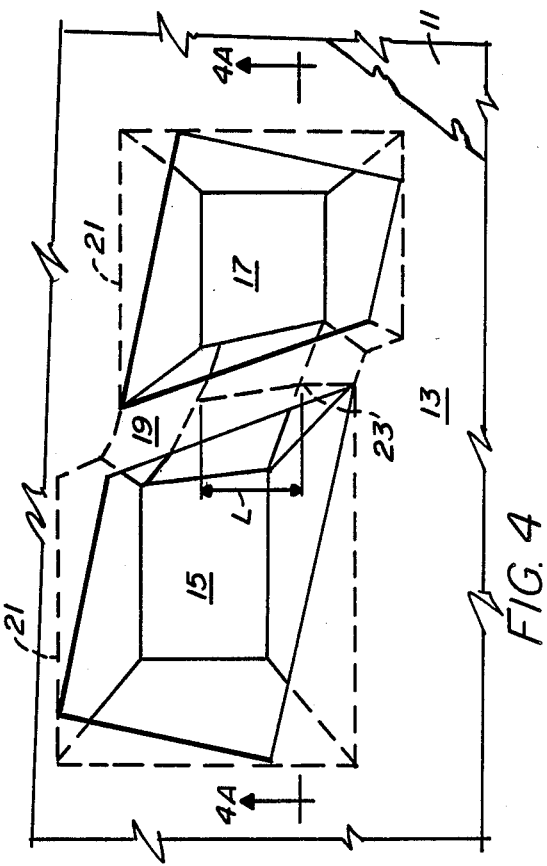
Figure 4A:
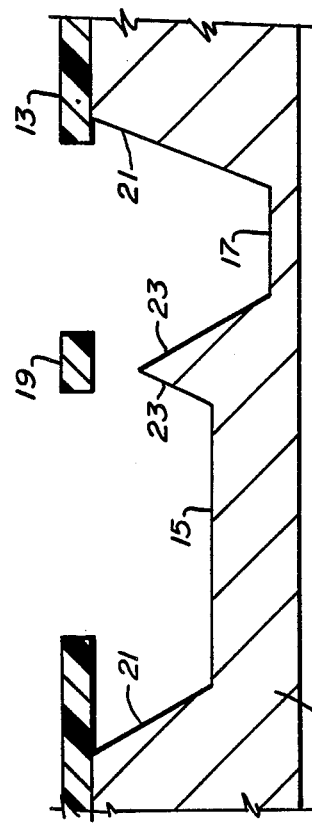

In FIGS. 4 and 4A it may be seen that the etch has continued until the region underneath the bridge region 19 is totally removed. The precise configuration of the underlying semiconductor substrate in the undercut region is typically quite complex but the bridge region 19 of the insulating layer 13 becomes completely separated from the underlying silicon or semiconductor layer for a distance L indicated in FIG. 4. The A—A cross section in FIGS. 3 and 4 is not through the center of the bridge. If it were, the bottoms in both FIGS. 3 and 4 would be at the same depth. As it is, one is deeper than the other because one is on the side wall and one is in the bottom.

A final or terminal over etch step can then be utilized to remove the ridge between the bottoms of the etched holes and to bring the entire bottom region to a terminal V-groove. The result of this step is indicated in FIGS. 5 and 5A, in which the bridge region 19 is at its full length spanning the opposite sides of the hole or cavity formed by the etch.

As a final step, and using suitable photolithography techniques, a conductive metallization pattern is formed on the surface of the insulating layer 13. In the embodiment of the invention as illustrated in FIG. 5, it may be seen that two conductor elements 25 and 27 are formed on the surface of the insulating layer 13. The two conductor elements 25 and 27 are connected by the fuse conductor 29. The fuse conductor 29 is a layer which is supported by the bridge region 19, extending between the two conductors 25 and 27. In order to prevent the metal from bridging over the underlying insulating layer and contacting the silicon, it is preferred that the mask for forming the windows be moved 10° off angle. This allows undercutting of the insulator as shown in FIG. 4. Preferably, the thermal coefficient of expansion of the insulator is low. In addition, the thermal coefficient of expansion of the metal used for the fuse conductor layer should be equal to or very close to that of the material in the bridge structure or the insulator is substantially thicker and thus stiffer than the metal. Otherwise, buckling or similar mechanical defects could result during temperature cycling.

Figure 5:
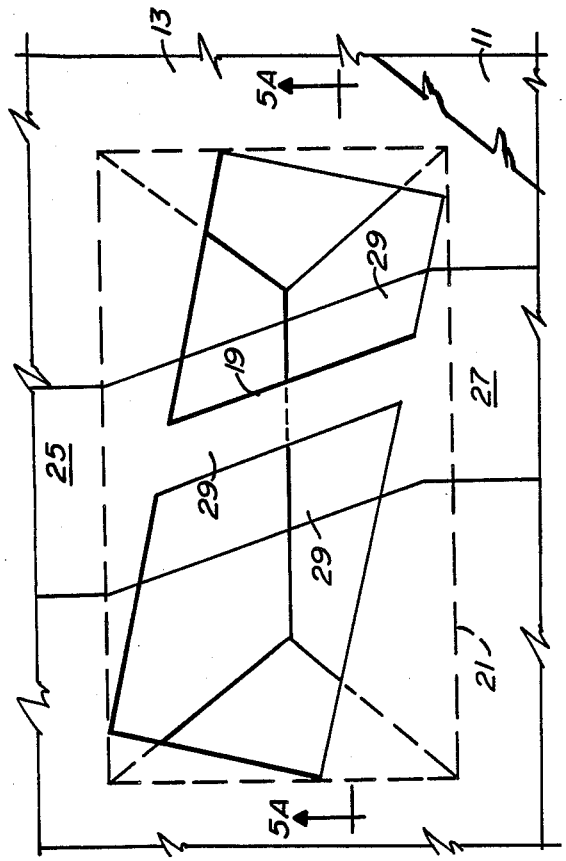
Figure 5A:
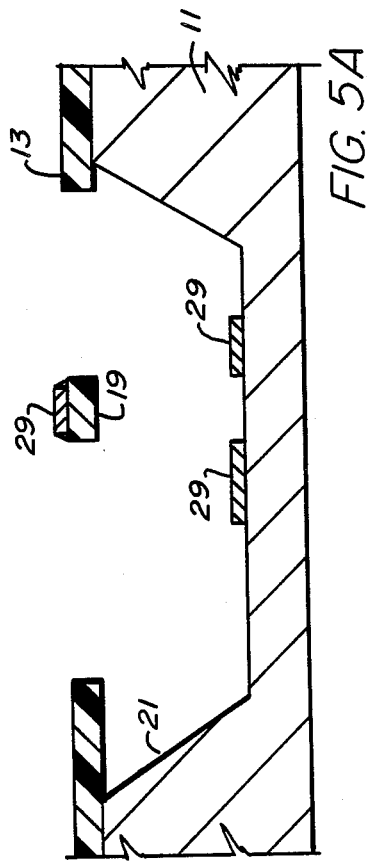

As may be seen from FIG. 5 and FIG. 5A, the cross section of thermal conductivity in the illustrated embodiment is reduced to two times the cross sectional area of the fused conductor 29 and the bridge region 19 as viewed in FIG. 5A. The only other heat losses from the fuse conductor are by conduction and radiation to the surrounding space. Naturally, if the surrounding space is a vacuum, heat conduction will be almost negligible.

In some instances, it may be unnecessary to completely undercut the bridge region 19 from both sides, in which case the bridge region 19 may be left connected to the remainder of the insulating layer 13 along part or all of one of its sides as well as its ends. Naturally, such a configuration dissipates more power into the insulating layer and contiguous substrate than would the configuration illustrated in FIGS. 5 and 5A.

The particular geometry of the windows, their spacing, and the depth of etch required, will depend upon the desired dimensions of the end product and by the crystal plane alignment of the substrate. However, instead of employing preferential etches as described above, it is possible to use non-preferential etches such as hydrofluoric and nitric acid to etch the substrate material independently of orientation. In such a case, the etch would be continued as far as necessary in order to provide the desired undercut. The final metallization step may be tailored to the particular requirements of the circuit, for example by metal sputtering.

It is also possible to form a bridge region by etching from the back side of the substrate. Also, depending on the type of metallizations used, one may be able to form the bridge portion without the need for any underlying supporting insulator.

In the illustrated embodiment, the bridge region 19 is shown disposed at an angle with respect to the geometry of the windows 15 and 19 and with respect to the geometry of the metallization. Although this is preferred, other geometries would be acceptable and are consistent with the scope of the present invention.

Figure 6:
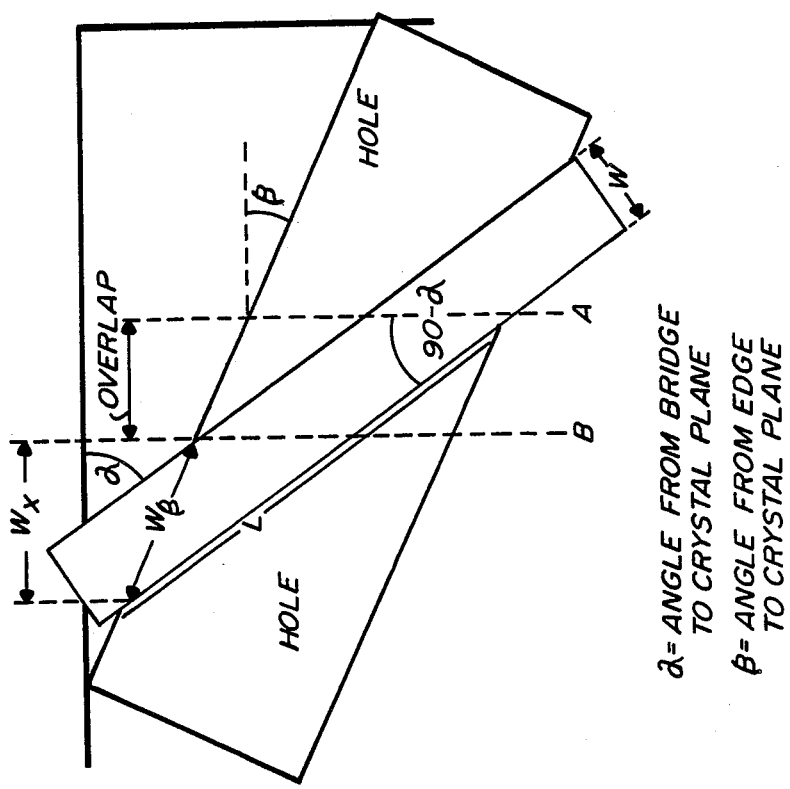
FIG. 6 is a plan schematic view illustrating certain dimensional and angular relationships in a preferred form of practicing the invention.

The length of the bridge region 19 and its width (e.g. width to length ratio) may be selected depending upon the materials used and the particular power requirements for fuse blowing. In the particular etching process described above, the dimensions of the bridge region also depend upon the characteristics of the etch utilized. Referring to FIG. 6, if the angle alpha ($\alpha$) equals 90° then no undercutting will occur. If the angle alpha is very close to 90° then the dimension L must be very long. For the bridge to completely be clear from the underlying substrate, the points A and B must have a projected overlap after etching is completed. For example, if point B is to the right of point A in the bridge region, then the bridge never clears. Thus, for total undercutting to occur, the overlap of the points A and B must exceed zero.

Referring to FIG. 6, if one assumes that A is the origin and all dimensions are positive, then a line of a length Z includes the overlap and an X projection of the width (W). Thus:

$$Z = \text{overlap} + W_x,$$

$$\sin(90 - \alpha) = \frac{z}{L}.$$

The projected bridge width along the edge is:

$$\frac{W}{W_B} = \sin(\alpha - \beta),$$

$$\frac{W_x}{W_\beta} = \cos(\beta).$$

Combining, one arrives at:

$$\frac{W_x}{W} = \frac{\cos\beta}{\sin(\alpha - \beta)}$$

Therefore:

$$\sin(90 - \alpha) = \frac{\text{overlap} + W \frac{\cos\beta}{\sin(\alpha - \beta)}}{L},$$

If $\beta = 0$, then $L = W/\sin \alpha \cos \alpha = 2W/\sin 2\alpha$. In the above equations, L must be at least as long as specified to assure clearing. It may be longer, Note also if either $\alpha = 0$ or $\alpha = 90°$, the bridge never clears and $L \rightarrow \infty$.

Typically, the variation in fuse current with fuse length for a particular fusible link geometry will drop significantly with length up to a ratio of about five length to one width. Specifically, if the length of the fuse conductor is halved, the total power require to blow the fuse typically doubles. Since the area is also decreased by two, the power density goes up by a factor of four.

For 1000 Å sputtered titanium fuse conductor in which the temperature coefficient of resistivity is about 0.15%/°C., the total fuse resistance is typically about 50 ohms when constructed in accordance with the invention. The fuse blows at about 75 ohms which means the average fuse temperature is about 160° C. The peak temperature in the middle of the fuse conductor is, of course, much higher, typically of the order of 300° C. to 500° C. Under such conditions, with the fuse conductor exposed to air, oxidation may be the principal phenomenon in fuse blowing rather than electromigration. Typical currents required to blow prior art fuses are of the order of 100 milliamps. However, fusible links made in accordance with the present invention typically blow with on the order of about 10 milliamps. Typical temperatures at fuse blowing are in the range of about 500° C., which is below the melting point of the metal. Thus, electromigration appears to be the principal phenomenon at work.

In the following example, an oxide bridge of about 8 μm, wide, and of varying length was formed. The titanium metallization was about 1000 Å thick, and the full width of the oxide bridge. The silicon substrate was etched to a depth of about 6 μm, which is close to the minimum necessary to fully undercut the oxide fuses. The approximate fuse currents and peak fuse power for these devices in vacuum are as follows:

| Length | Resistance | Fuse Current | Fuse Power |
|--------|------------|--------------|------------|
| 12 μm  | 30 ohms    | 15 ma        | 10 mW      |
| 20 μm  | 50 ohms    | 10 ma        | 7.5 mW     |
| 44 μm  | 110 ohms   | 4 ma         | 2.6 mW     |
| 200 μm | 500 ohms   | 1.5 ma       | 1.6 mW     |

When the fuses are blown in air, the results for the two shorter fuses are little changed, but the fuse currents for the longer devices are increased to about 6 ma. The predominate heat loss mechanism for a long fuse is conduction through air and not the bridge itself. This conduction through air can be greatly reduced by increasing the depth of the silicon etch, which decreases the current needed to blow the fuse. Thus, by controlling the geometry of the device and the metallization parameters, a wide range of fuse currents and peak power can be obtained.

It may be seen, therefore, that the invention provides an improved fusible link in which the power required to blow the fuse is significantly lower than that required by the prior art. Fuses of the invention are consistently close in the level of power required to blow the fuse as compared to prior art devices. Further advantages include: the inventive fuse can be added using only one additional process step; power level is totally adjustable to meet specific application, unlike most existing fuse structures; no high resolution lithography is needed, unlike other apparatuses; and no special metallization is required to form the fuse. Various modifications of the invention in addition to those shown and described herein will become apparent to those skilled in the art from the foregoing description and accompanying drawings. Such modifications are intended to fall within the scope of the appended claims.

What is claimed is:

1. A fusible link comprising:
a semiconductor substrate;
an electrically insulating layer disposed on said substrate;
a pair of conductor elements on the surface of said insulating layer opposite said substrate;
a fuse conductor layer on the surface of said insulating layer opposite said substrate electrically coupling said conductor elements; and
said insulating layer and said substrate defining a cavity adjacent said fuse conductor layer such that a bridge is formed over said cavity, said bridge being a portion of said insulating layer upon which said fuse conductor layer is disposed, said fuse conductor layer on said bridge being sized such that a predetermined electrical power input to said fuse conductor layer produces an open circuit between said pair of conductor elements, the relative sizing of said fuse conductor layer on said bridge and said portion of said insulating layer being such that said portion of said insulating layer provides substantial mechanical support for said portion of said fuse conductor layer thereon and, in conjunction with said cavity, substantially decreases the thermal conductivity from said fuse conductor layer thereon to said substrate.

2. A fusible link according to claim 1 further comprising a second cavity, both of said cavities being disposed on opposite sides of said fuse conductor layer.

3. A fusible link according to claim 2 wherein each of said cavities is defined by a pair of windows in said insulating layer, said windows collectively defining a substantially rectangular area, and wherein said fuse conductor layer comprises a strip extending between opposite parallel sides of said substantially rectangular area and intersecting said sides at an oblique angle.

4. A fusible link according to claim 3 wherein said semiconductor substrate is silicon and wherein said oblique angle is oblique to the 110 crystal plane of said silicon substrate.

5. A fusible link according to claim 4 wherein said insulating layer comprises silicon dioxide and wherein said fuse conductor layer comprises sputtered titanium.

6. A fusible link according to claim 1 wherein the thickness of said fuse conductor layer is substantially less than the thickness of said portion of said insulating layer providing support for said portion of said fuse conductor layer thereon.

7. A fusible link according to claim 6 wherein the thickness of said insulating layer providing support for said portion of said fuse conductor layer thereon is a factor of 3 to 10 times thicker than the thickness of said fuse conductor layer thereon.

8. A fusible link according to claim 1 wherein said bridge is of a length greater than either of its width and its thickness.

9. A fusible link comprising:
a semiconductor substrate;
an electrically insulating layer disposed on said substrate;
a pair of conductor elements on the surface of said insulating layer opposite said substrate;
a fuse conductor layer on the surface of said insulating layer opposite said substrate electrically coupling said conductor elements; and said insulating layer and said substrate having a cavity formed therein so as to leave a bridge comprises of a portion of said insulating layer and a portion of said fuse conductor layer thereon spanning said cavity, said fuse conductor layer on said bridge being sized such that a predetermined electrical power input to said fuse conductor layer produces an open circuit between said pair of conductor elements, the relative sizing of said fuse conductor layer on said bridge and said portion of said insulating layer being such that said portion of said insulating layer provides substantial mechanical support for said portion of said fuse conductor layer thereon and, in conjunction with said cavity, substantially decreases the thermal conductivity from said fuse conductor layer thereon to said substrate.

* * * * *

UNITED STATES PATENT AND TRADEMARK OFFICE
CERTIFICATE OF CORRECTION

Page 1 of 2

PATENT NO. : 4,879,587
DATED : John H. Jerman et al.
INVENTOR(S) : November 7, 1989

It is certified that error appears in the above-identified patent and that said Letters Patent is hereby corrected as shown below:

TITLE PAGE: Item (75)

Under the heading "Inventors:", change "Duderik W. DeBruin" to --Diederik W. DeBruin--.

In column 3, line 20, after "etches" change the comma to a period.

In column 5, line 21, change "$W_B$" to --$W_\beta$--.

In column 5, line 35, insert the following omitted text after the initial formula:

--$L = W \cos \beta / \sin (\alpha-\beta) / \sin (90-\alpha)$, $L = W \cos \beta / \sin (\alpha-\beta) / \cos \alpha$.--

In column 5, line 39, after "longer," insert --however.--.

In column 5, line 64, before "Typical" insert --In a vacuum,-- and then change "Typical" to --typical--.

UNITED STATES PATENT AND TRADEMARK OFFICE
CERTIFICATE OF CORRECTION

PATENT NO. : 4,879,587
DATED : John H. Jerman et al.
INVENTOR(S) : November 7, 1989

It is certified that error appears in the above-identified patent and that said Letters Patent is hereby corrected as shown below:

In column 8, line 16, change "comprises" to --comprised--.

Signed and Sealed this

Twenty-eighth Day of April, 1992

Attest:

HARRY F. MANBECK, JR.

*Attesting Officer*      *Commissioner of Patents and Trademarks*